United States Patent [19]
Bernstein et al.

[11] Patent Number: 5,164,726
[45] Date of Patent: Nov. 17, 1992

[54] SELF CALIBRATING DUAL RANGE A/D CONVERTER

[75] Inventors: Lawrence J. Bernstein, Honeoye Falls, N.Y.; Terence W. Mead, Hertford, England

[73] Assignee: Eastman Kodak Company, Rochester, N.Y.

[21] Appl. No.: 715,092

[22] Filed: Jun. 12, 1991

[51] Int. Cl.⁵ .......................................... H03M 1/10
[52] U.S. Cl. ..................................... 341/120; 358/174
[58] Field of Search ............... 341/120, 139, 155, 156; 358/174, 163

[56] References Cited

U.S. PATENT DOCUMENTS

| | | | |
|---|---|---|---|
| 4,521,811 | 6/1985 | Stoughton et al. | 358/243 |
| 4,559,523 | 12/1990 | Wakita | 341/155 X |
| 4,875,048 | 10/1990 | Shimizu et al. | 341/156 |
| 4,896,155 | 1/1990 | Craiglou | 341/120 |
| 4,903,023 | 2/1990 | Evans et al. | 341/120 |
| 4,907,084 | 3/1990 | Nagafusa | 358/171 |
| 4,908,621 | 3/1990 | Polonio et al. | 341/120 |
| 5,053,771 | 10/1991 | McDermott | 341/156 |

OTHER PUBLICATIONS

Mitchell, Ray "The Marconi B3410 Line Array Telecine," *SMPTE Journal*, Nov. 1982, pp. 1066-1070, described in the specification on page 3, line 30.
Mitchell, Ray "Digital Video Processing for Telecine," *IBC* 1982, IEE Conf. Publ. N220, IEE London, U.K. pp. 41-45, Sep. 18-21, 1982 see pg. 3, line 28.
Milch, "High Resolution Digitization of Photographic Images with an Area Charge-Coupled Device (CCD) Imager," SPIE vol. 697, Appl. of Digital Image Proc. IX 1986, pp. 96-104 p. 4, line 10 (specification).
Oliphant, Andrew & Weston, Martin, "A Digital Telecine Processing Channel," *SMPTE Journal*, vol. 88, Jul. 1979, pp. 474-479, in the specification page 3, line 5.

*Primary Examiner*—A. D. Pellinen
*Assistant Examiner*—B. K. Young
*Attorney, Agent, or Firm*—David M. Woods

[57] ABSTRACT

A dual range A/D converter includes a gain matching circuit for balancing the upper end of the transfer curves of the level-dependent dual A/D signal paths of the converter so as to control crossover between the paths. One path (high gain path) is provided with signal gain that is a nominal multiple of gain applied to the other path (low gain path). A digital comparator compares the digital code word output of flash A/D converters included in the respective paths, with the output from the high gain path being scaled down to correspond to the output from the low gain path. If a difference is detected, the upper ladder reference of the flash converter in the low gain path is adjusted until the respective gain difference becomes substantially an exact multiple. When this matching is combined with black level correction, which equalizes the lower end of the transfer curves, a fully self-calibrating dual range A/D converter is obtained.

14 Claims, 7 Drawing Sheets

SELF CALIBRATING DUAL RANGE A/D CONVERTER

BACKGROUND OF THE INVENTION

1. Field of the Invention

This invention pertains to the field of digital signal processing and, in particular, to the field of analog to digital (A/D) conversion.

2. Background Art

In most digital video processing, eight bits are used to represent each sample. This number has been found adequate to reduce the effects of quantizing to an acceptable level when the signals being digitally coded are composite video signals that have already been gamma corrected. As compared with the conversion of composite PAL or NTSC signals into digital form, however, the A/D conversion of color component signals prior to video processing (especially gamma correction) requires a significantly greater bit accuracy. More particularly, when signals are digitally coded before gamma correction, the visibility of quantization noise is increased in low light. (This is because gamma correction increases the gain for signals near black.) Low level component signals therefore need to be coded to more than the usual eight bits coding resolution.

Coding requirements for a telecine (a machine for converting film images into video signals) are relatively more stringent than for other video systems, e.g., a video camera. This is because the film scanned by the telecine has its own characteristics which have to be compensated in order to provide good television pictures. In particular, the telecine must process a much larger input contrast range than a live camera because of the expansion in contrast produced by the film gamma. As a result, correction down to much lower values of gamma is required from a telecine in order to compensate for both the display tube gamma and the film gamma. In addition to gamma correction, film exposure may need to be compensated and the opertor's preference for color and density correction may need to be allowed for.

If the digitization of the primary R, G, B signals take place before gamma correction, at least 11 bits are ordinarily needed for a telecine video processing channel. High speed, single-stage A/D converters (e.g., parallel, or flash, converters) with such extended resolution or multi-state A/D converters (e.g.., subranging converters), however, either are not currently available or are inconvenient to implement (cost, availability, etc.). However, the extra resolution is needed only when the input signal is small. To achieve greater resolution without the greatly increased complexity of developing an extended range A/D converter, 8-bit A/D converters have been modified so as to insert analog preamplification whenever the input signal falls below a predetermined threshold. The preamplification factor is ordinarily an exact power of 2; thus the eight-bit word from the A/D converter can be located within a longer word by simply displacing it by the appropriate number of binary places.

Tests of visibility of quantization effects on signals that have been linearly coded and subsequently gamma corrected show that the smallest fractional change in perceived luminance that can be seen is about 2%, and the perceived fractional change does not start to rise rapidly above 2% until the signal level falls below about 15%, a preamplification factor of 8 can be applied to input signals falling below 12.5% of peak (the predetermined threshold). This will give three extra bits at signal levels below 12.5% (see "A Digital Telecine Processing Channel," by A. Oliphant and M. Weston, *SMPTE Journal*, July 1979, vol. 88, pp. 474–480). For example, the model B3410 Telecine, manufactured by Marconi Communications Systems Ltd., England, incorporates 11 bit A/D conversion provided by an 8 bit A/D converter and a gain switching system. The A/D conversion has a normal accuracy range and a fine accuracy range. Input signals falling between 12.5% and 100% of peak white are digitized over the whole 8 bit range of the converter to provide the eight MSBs of the output signal. Input signals falling below 12.5% of peak are amplified eight times and are then digitized to provide eight LSBs of the 11 bit output signal. The output signal is provided as shown below for high contrast film:

| bit | 10 | 9 | 8 | 7 | 6 | 5 | 4 | 3 | 2 | 1 | 0 |
|---|---|---|---|---|---|---|---|---|---|---|---|
| fine accuracy ($<\frac{1}{8}$ max) | O | O | O | X | X | X | X | X | X | X | X |
| normal accuracy ($>\frac{1}{8}$ max.) | X | X | X | X | X | X | X | X | O | O | O |

(see "Digital Video Processing for Telecine," by R. Matchell, IBC 1981, *IEE Conference Publication* N110, IEE London, U.K., pgs. 41–45; "The Marconi B3410 Line Array Telecine," by R. Matchell, *SMPTE Journal*, Nov. 1982, pp. 1066–1070).

Such level-dependent A/D converters are sometimes called dual range (or range-changing) converters, and typically include two separate conversion paths, one path with a multiple of the gain of the other path. A comparator, or a comparison-type operation, switches the input samples from one path to the other as the input video signal level passes a preset threshold level. One approach is to "gang" together two flash A/D converters such that the low gain path in effect has a coarser step size than the high gain path (see the dual-ranging A/D converter disclosed in "High-resolution digitization of photographic images with an area charge-coupled device (CCD) imager" by J. R. Milch, SPIE Vol. 697, *Applications of Digital Image Processing IX* (1986), pp. 96–104). A known dual range A/D converter of this type is shown in FIG. 1. Input analog signals are applied to a first M bit A/D converter 10 that is used in a low gain signal path A to generate first digital signals and a second M bit A/D converter 12 that is used in a high gain signal path B to generate second digital signals. The low gain path A is provided with unity gain from an amplifier 14 while the high gain path B is provided with a gain of 2N from an amplifier 16. The low gain path is used when the input signal $V_{IN}$ is greater than (Vmax/2N) and the high gain path is used when the input signal is less than or equal to (Vmax/2N). (Vmax is the maximum value that signal $V_{IN}$ may become.) A comparator 18 compares the code values of the second digital signals to a suitable switch-over code word (usually just less than Vmax/2N) and thereby controls a digital multiplexer 20 to select the data path to be utilized. (An overflow flag (OVF) from the second A/D converter 12 could also be used to control the multiplexer 20. Similarly, an analog comparator could be used to compare the analog input to the A/D converters 10 and 12.)

The multiplexer 20 includes registers 20a and 20b for assembling an output code word from the M data bits and N zero bits, the latter being joined to the M data bits to fill out the output code word. The output of the multiplexer 20 thus is (M+N) bits, wherein the N bits form the zero LSBs of the low gain signal path A and the highest MSBs of the high gain signal path B. In a typical application, the M bit A/D converters 10 and 12 are conventional 8 bit (M=8) flash-type A/D converters, and a gain of eight (i.e., N=3) is applied to the high gain path B, thereby resulting in an output of 11 (M+N) bits from the multiplexer 20. This results in two accuracy ranges; high accuracy at low signal levels and low accuracy at high signal levels (see FIG. 2). (The added accuracy N, is determined by the log base 2 of the gain in the amplifier prior to the lower A/D converter 12, while the base accuracy M is determined by the individual A/D converter. The resultant data word size is (M+N) bits.) This can be thought of as a crude approximation to the characteristics of the human visual system, and provides a near constant (quantization step size to input signal level) ratio after digitization.

Since the dual range A/D converter architecture requires signal dependent paths in order to perform as required, it is necessary that each signal path have similar electrical characteristics, be precisely aligned with respect to the other path, and have an A/D conversion crossover point that matches the theoretical transfer characteristic to within the system's required accuracy. For the dual range A/D converter shown in FIG. 1, the crossover point matching needs to be maintained to within half an LSB of M bits (plus or minus Vmax/((2**(M+1)−1))). The difficult task of calibrating the signal paths of a dual range A/D converter is complicated by the effects of temperature and long term stability of the signal path components.

The signal paths of the dual range A/D converter shown in FIG. 1 have transfer functions (Input Signal versus Output Digital Word for each individual A/D converter) as illustrated in FIG. 3. To maintain calibration of the dual range A/D converter, the transfer function of each converter path must have two points on the transfer curve precisely aligned with respect to similar points on the transfer curve of the other path. Assuming a linear transfer function, the first point will define the black level offset and the second point will set the slope or gain. In addition, the video signal levels in each path must be set in accordance with the A/D converter's operating range.

As can be seen from FIG. 3, the bottom end of the transfer curves requires that both signal paths of the dual range A/D converter output the same digital word (zero or some other desired digital offset above zero) when a black reference level is input from a sensor. This is accomplished by using either a digital or analog black level correction circuit, which automatically clamps on the reference black interval in the video (provided by dark pixels outside the image area in the case of a charge-coupled device (ccd) imager) and precisely sets the black reference level in each A/D converter path to the desired operating point. The analog black level correction method illustrated in FIG. 4 is disclosed in the earlier-cited paper by Oliphant and Weston. The two level-dependent signal paths A and B are followed by a dual sample and hold 30 and a single A/D converter 32 instead of using, as shown in FIG. 1, two signal paths, each having its own A/D converter. The proper path is selected by a comparator 34 driving a Flip-Flop 36 to generate a range indication signal that triggers the appropriate bit-shift after the A/D converter 32. The analog voltage of each path is sequentially sampled for the dark reference pixels in respective black level clamp feedback networks 38 and 40 and compared with a stable black reference voltage. A dc offset correction voltage is then generated, which is added to the video input (adders 42 and 44) to balance any inequality sensed by each comparator.

Black level correction can also be implemented digitally by comparing the digital data from the dark pixels in each A/D converter path with a black reference digital code, and either adding (positive or negative) a digital offset to the data word or feeding back an analog signal to offset the video input into the A/D converters. A known circuit for digital black level correction with analog feedback is illustrated in FIG. 5. A digital comparator 50, which is enabled during the black level correction period, compares the dark pixel code on its input A with a black reference digital code on its input B. If the dark pixel code is greater than the black reference digital code, then the output (A>B) provides an offset voltage that is accumulated on a capacitor 52 and fed back to an subtractor 54 to decrease the level of the input signal. This brings the input black level down to the digital black reference. If the dark pixel code is less than the black reference digital code, then the output (A<B) of the comparator 50 is inverted by an inverter 56 and applied to the capacitor 52, thereby discharging the capacitor 52 until the value subtracted from the video input brings the output of the subtracter 54 up to the black reference code. The dark pixels are typically available every line so that the capacitor 52 is brought to the black reference value for every line (or periodically for every few lines)

Black level correction satisfies the requirement for automatically establishing and matching the bottom end point of the transfer curves in each A/D converter path. In this sense, the known dual range A/D converter automatically self-calibrates for black level. However, it cannot be fully self-calibrating because it does not automatically match or stabilize a second point. In previous attempts to deal with this problem, the gain matching or setting of the second transfer curve point relied on high accuracy and low temperature coefficient components. As the requirements for digital word size M increased, these attempts have proven to be ineffective.

SUMMARY OF THE INVENTION

We have found that it is possible to automatically balance the gain in the level-dependent paths of a dual range converter and, when combined with an automatic black level circuit, thereby achieve a fully self-calibrating system.

A dual range converter according to the invention is operative in two signal paths, a first signal path including a first analog-to-digital converter for converting analog input signals into first digital signals, and a second signal path including a second analog-to-digital converter for converting analog input signals into second digital signals. Signal gain is applied to the respective paths such that the gain applied to the second path is a nominal multiple of the gain applied to he first path.

The signal level in the respective paths are evaluated, the signal in one of the paths being scaled with respect to the other path to account for the nominal gain difference. A control signal is then generated to indicate the difference in signal level between the scaled signals. Means are provided that respond to the control signal and adjust the signals in at least one of the paths until the gain applied in the second path is substantially an exact multiple of the gain applied in the first Path. (This establishes the upper end point of the respective transfer curves.) A digital output is then selected according to the magnitude of the signals in the respective signal paths.

When a gain matching circuit according to the invention is combined with a black level correction circuit (which establishes the lower end point of the respective transfer curves), a fully self-calibrating dual range A/D converter is obtained.

BRIEF DESCRIPTION OF THE DRAWINGS

The prior art and the invention are described in relation to the figures, in which.

DESCRIPTION OF THE PREFERRED EMBODIMENT

Figure 5:
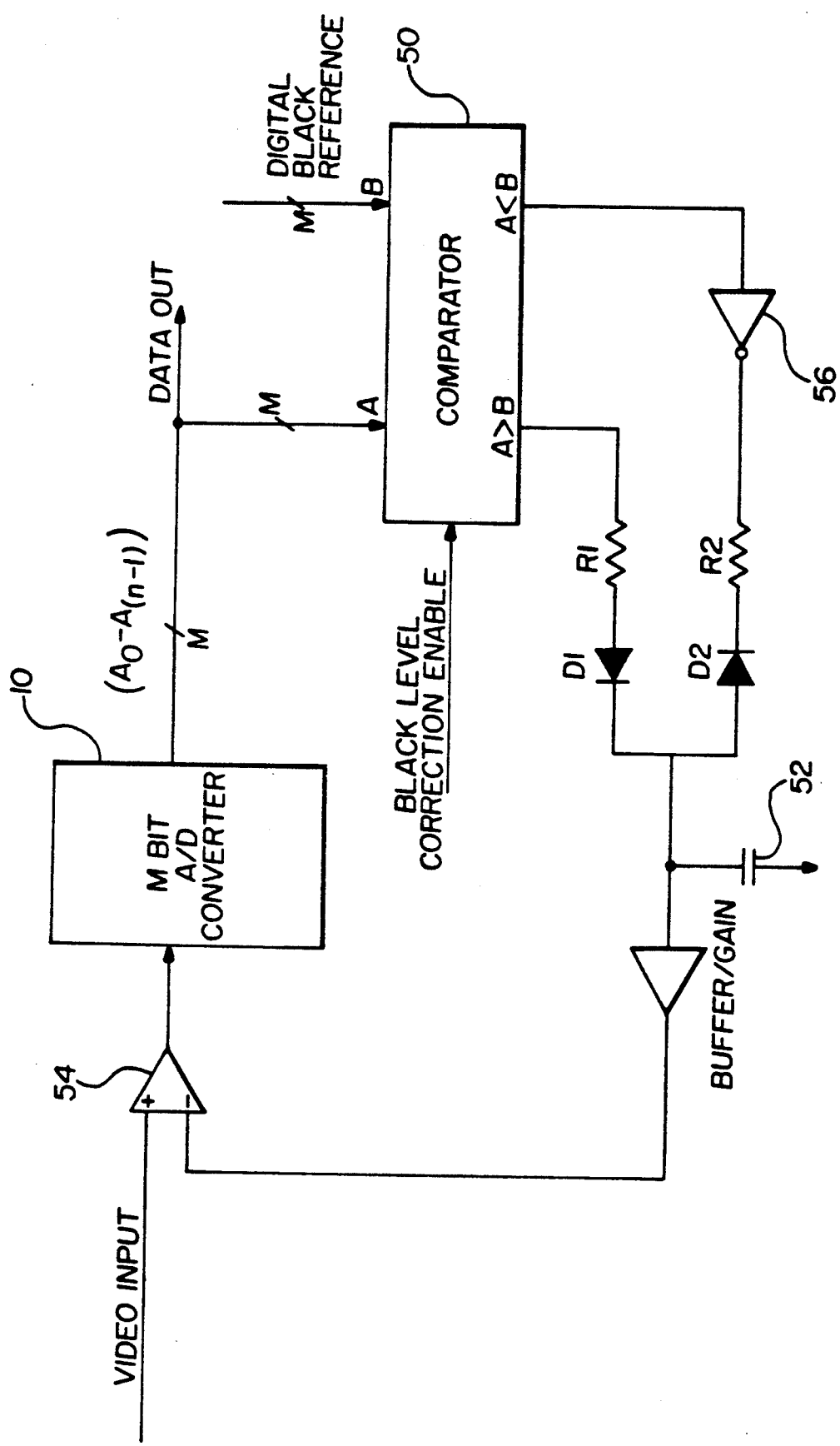
FIG. 5 is a block diagram of a digital black level correction circuit for use in a dual range A/D converter such as shown in FIGS. 1 or 4.
Figure 6:
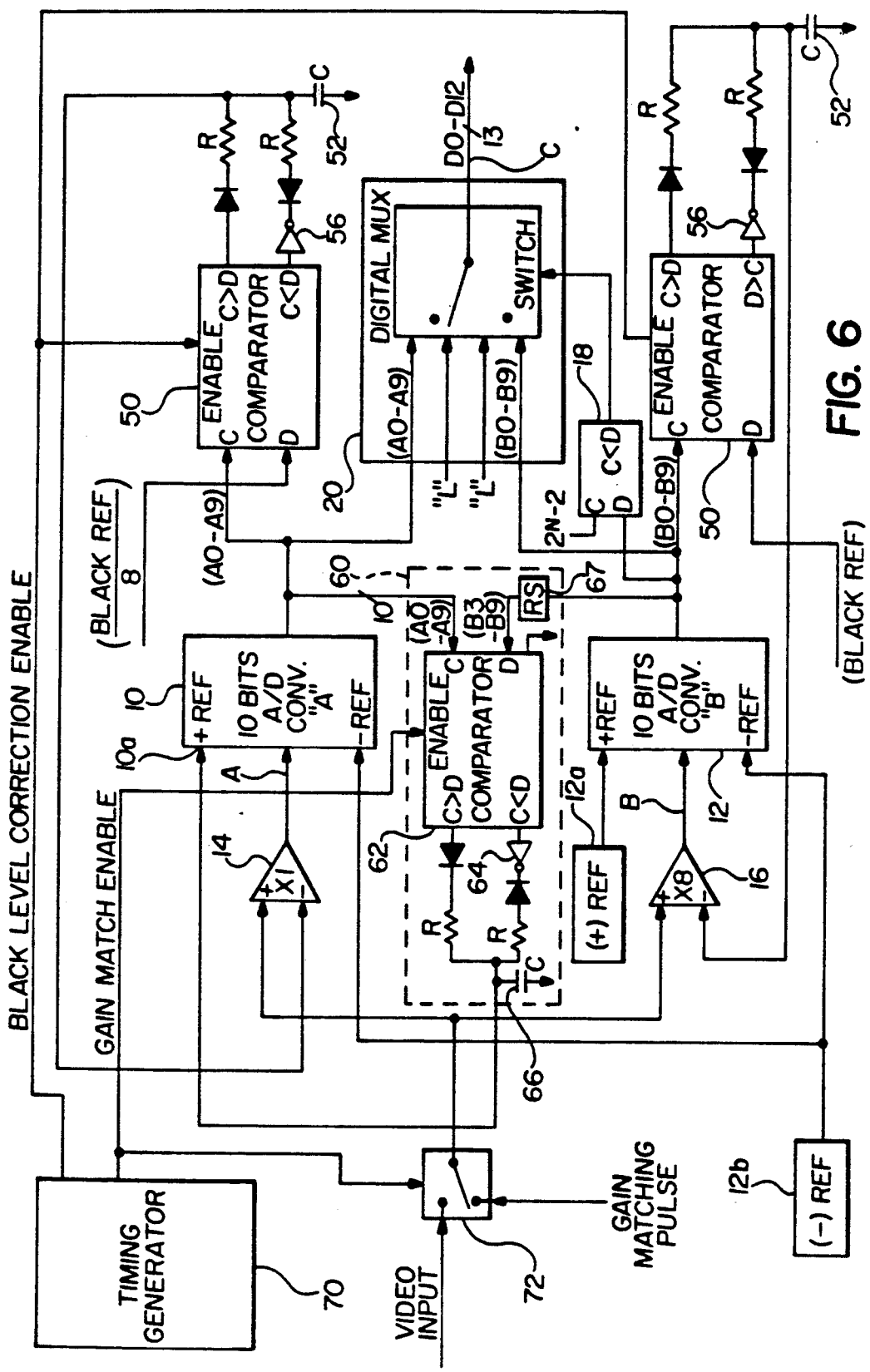
FIG. 6 is a block diagram of a fully self-calibrating dual range A/D converter incorporating a gain matching circuit in accordance with the invention.

In describing the dual range A/D converter shown in FIG. 6, identical reference numerals are used to describe elements already discussed in relation to the preceding figures. In one variation, the black level correction provided by the digital comparators 50 charging (or discharging) the capacitors 52 is fed back to offset the inverting inputs of the gain-setting amplifiers 14 and 16 (rather than to a separate differencer 54, as shown in FIG. 5). The A/D converters 10 and 12 are conventional 10 bit flash A/D converters (M=10) (e.g., the AD9060 flash A/D converter manufactured by Analog Devices), and the gain multiplier for the high gain path B is based on three additional bits (N=3), resulting in a 13 bit (M+N) output word C.

Figure 3:
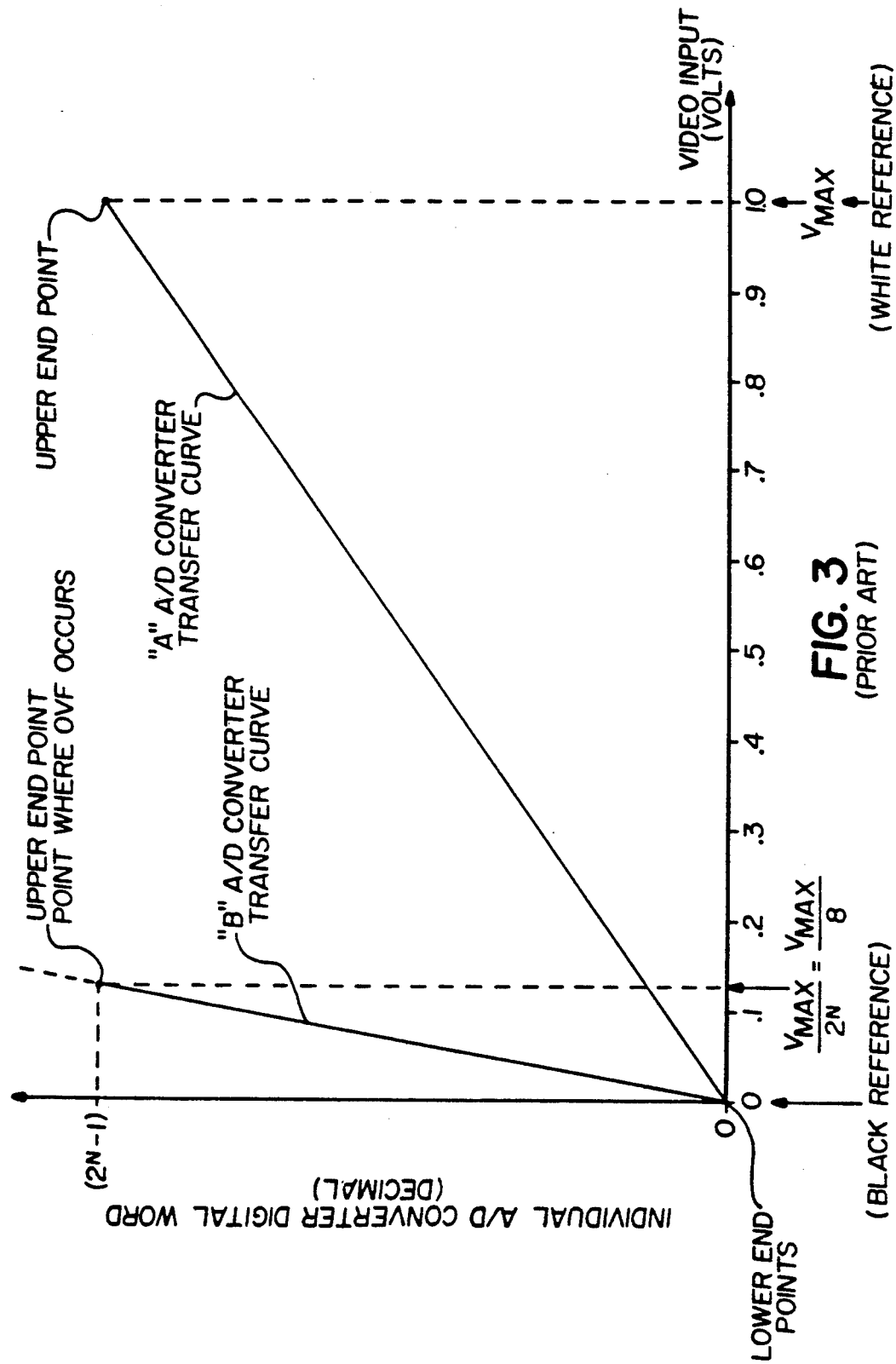
FIG. 3 is a graph of the transfer curve of each signal path of the dual range A/D converter shown in FIG. 1.
Figure 4:
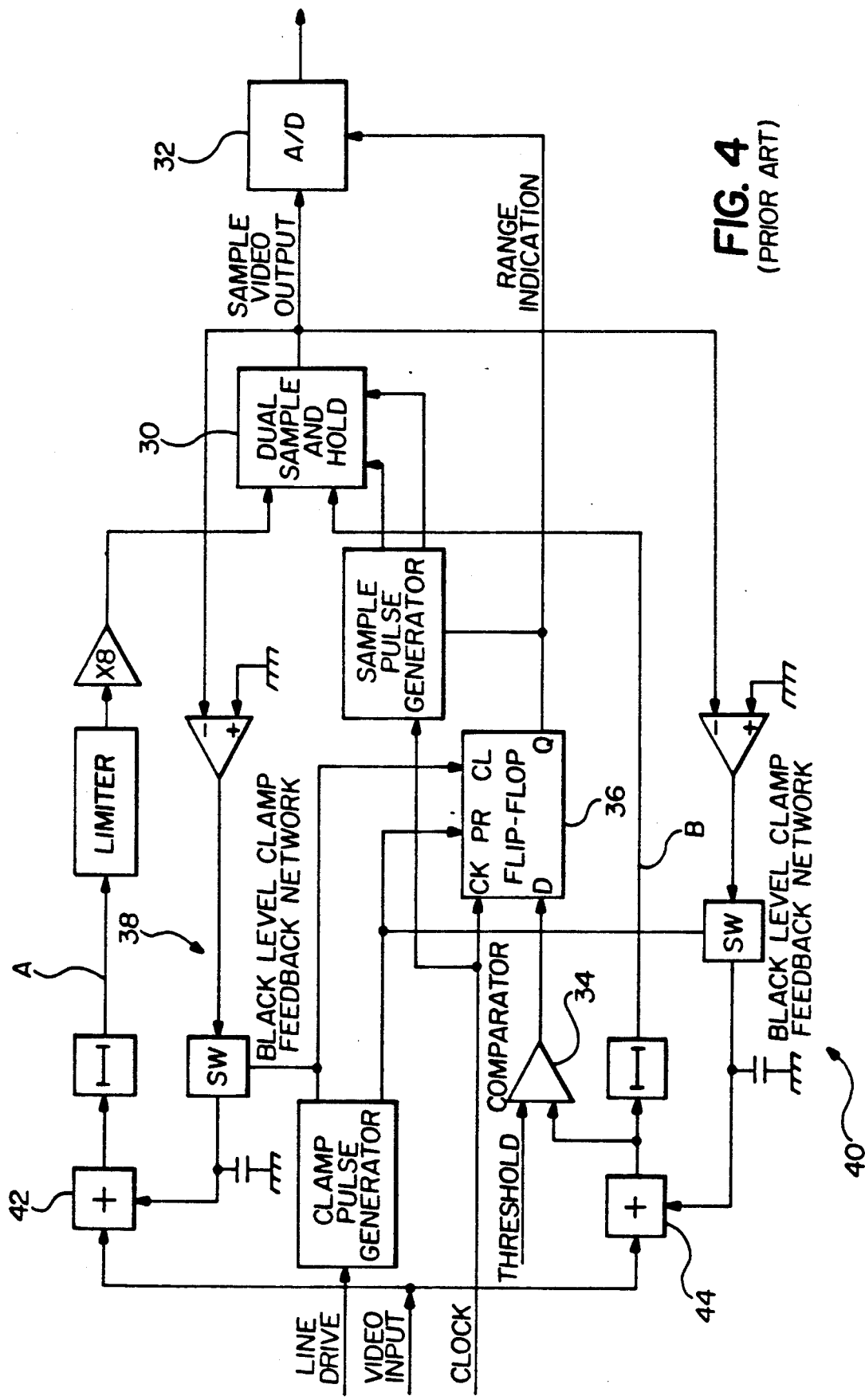
FIG. 4 is a block diagram of another known dual range A/D converter, this one using a dual sample and hold, a single A/D converter, and a black level correction circuit.

The upper end points of the transfer curves shown in FIG. 3 are matched in the dual range A/D converter circuit of FIG. 6 by a gain matching circuit 60. In other words, the digital word output of each A/D converter 10 and 12 is calibrated to be the same for transfer end points that correspond to a defined relationship (i.e., the same output word for Vmax and Vmax/2**N). The gain matching circuit 60 uses a digital comparator 62, an inverter 64, and a capacitor 66 in evaluating the signals in the respective paths. The inputs C,D of the comparator 62 are connected to the outputs of the A/D converters 10 and 12, respectively. Input D accepts the 7 MSBs (B3-B9, see FIG. 7) of the 10 bit signal in the high gain path B, which are right-shifted by three bits in a hard-wired shift 67, in effect scaling the digital signals from the second path B to correspond to the signals from the first path A, that is, dividing by eight. Input C accepts the full 11 bits (A0-A9, see FIG. 7) from the low gain path A. One comparison output (C>D) is connected through a rectifying diode and resistor to the capacitor 66 while the other comparison output (C<D) is inverted by the inverter 64 before being connected through a similar diode and resistor to the capacitor 66. The respective resistor and the capacitor 66 provide a relatively long time constant for charging and discharging the capacitor 66. The output of the capacitor 66 is connected to the upper ladder reference voltage terminal 10a of the A/D converter 10. The value on the terminal 10a effectuates an adjustment of the gain applied to the digital signals in the first path A. A timing generator 70 provides a gain match enable pulse to the comparator 62 to initiate the gain matching procedure.

The gain of the high gain path B is a nominal multiple of the gain of the low gain path A. In the preferred embodiment, the gain of path B is eight times the gain of path A (2**N; N=3), and the crossover point between the signal paths will therefore occur at or below one-eighth of full-scale (Vmax/8). As shown in FIG. 6, the gain of the low gain path A is modulated by the gain matching circuit 60 so as to be referenced to the gain of the high gain path B. The circuit 60 will force the gain of path A to be equal to (within +/- ½ LSB of M bits at the crossover point) one-eighth the gain of path B. Modulating the gain can be accomplished by either having a controllable analog gain stage prior to the A/D converter 10, a digital multiplier after the A/D converter 10, or as illustrated in FIG. 6, using the upper ladder reference voltage terminal 10a of A/D converter 10.

Figure 7:
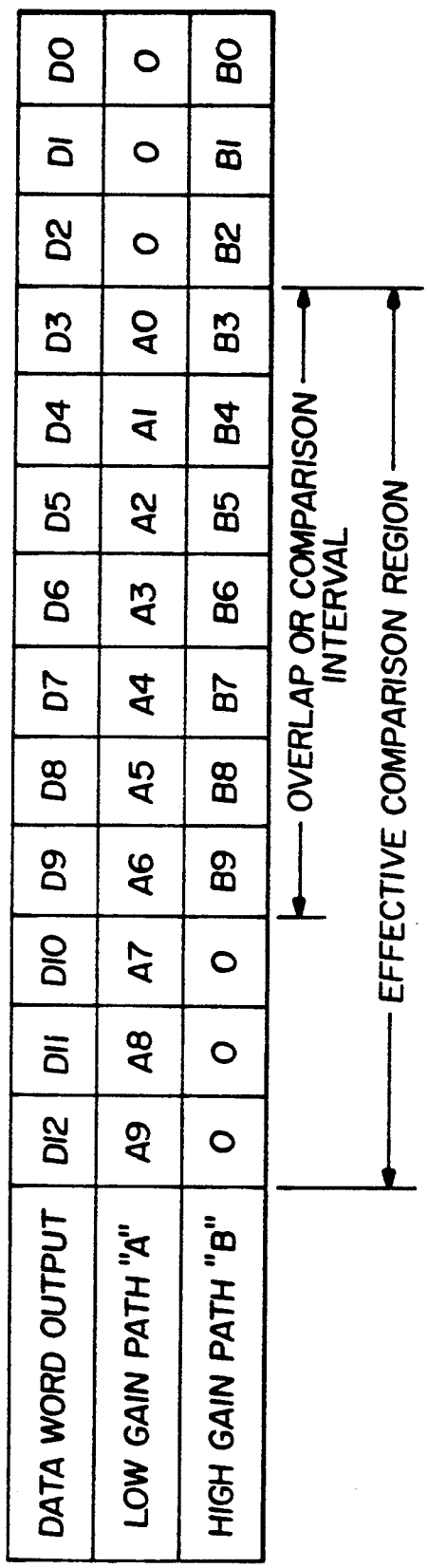
FIG. 7 is a chart showing the relative placement of the data generated for each range of the dual range A/D converter shown in FIG. 6.

FIG. 7 shows the relative placement of the data from each A/D converter 10 and 12 into the resultant data word C generated by the self calibrating dual range A/D converter shown in FIG. 6. Illustrated with conventional 10 bit A/D converters (M=10), the resultant data word is (M+N) 13 bits, with the data from the low gain path A being offset 3 bits (N=3) with respect to the data from the high gain path B. All missing bits in the individual paths A and B have been padded with zeros. The (M−N) 7 bit region which is common to both A/D converter paths is referred to as the "overlap or comparison" interval. Since the 10 bit word from high gain path B is right-shifted by three bits as it is applied to input D of the comparator 62, the "overlap" interval for high gain path B represents the signal in path B divided by 8. With the signals on input C and D of the comparator 62 being nominally equivalent as to gain, a valid comparison can be obtained.

During the gain match enable interval of the input video signal, a gain matching pulse of appropriate amplitude is input through a switch 72 (or injected on top of the input video) when the switch is activated by the timing generator 70 in concert with the gain matching circuit 60. The pulse, which facilitates in matching the gain of the separate A/D converter paths A and B, has a pulse amplitude that is slightly less than one-eighth of Vmax, so that both A/D converter paths are in their "overlap" region where the most accurate matching of the transfer curves may be obtained. In particular, during the gain match interval the 3 MSBs (A7-A9) from the low gain path A will be zero. The seven digital bits in the overlap interval (D3-D9) of the individual A/D converter paths are compared (A0–A6 compared to B3–B9). A gain correction signal is generated from this comparison that modulates the gain of A/D converter 10 by varying its upper ladder reference and thereby forces the gain in the low gain path A to be one eighth the gain of the high gain path B. Since the amplitude of the gain matching pulse is less than Vmax/8, and the upper three bits from path A will be "low", an additional three bits of resolution are provided in the gain match comparison. Altogether, therefore, there is an effective comparison region of 10 comparison bits, which achieves a gain matching accuracy capability of 2**10 (1024) or +/−1 part in 2048 (+/−½ an LSB of M bits).

The digital comparator 62, which is enabled by the timing generator 70 during the gain matching interval, compares the "overlap" interval bits (A0–A6) provided by the A/D converter 10 (in the low gain path A) with the "overlap" interval bits (B3–B9) provided by the A/D converter 12 (in the high gain path B). If the value from the low gain path A is greater than the value from the high gain path B (C>D), then an offset voltage is accumulated on the capacitor 66 and fed back to the A/D comparator 10 to increase its ladder reference voltage. This increases the reference level for each of the inherent comparators (not shown) making up the A/D converter 10, causing fewer comparators to turn on for a given input (the gain matching pulse), thereby lessening the slope of the transfer characteristic (FIG. 3) for the low gain path A. This tends to drop the gain of the low gain path A in relation to the level of the high gain path B. The second end points, and therefore the slope of the transfer curves for both paths, will then be matched. Conversely, if the value from the low gain path A is less than the value from the high gain path B (C<D), the output of the comparator 62 is inverted by the inverter 64 and applied to the capacitor 66, thereby discharging the capacitor 66. This decreases the ladder reference voltage applied to the A/D converter 10, causing more comparators to turn on for a given input (the gain matching pulse), thereby increasing the slope of the transfer characteristic for the low gain path A. This tends to increase the gain of the low gain path A in relation to the gain level of the high gain path B.

The lower end of the transfer characteristics shown by FIG. 3 are matched by use of two identical black level correction circuits, each comprising the digital comparator 50, the inverter 56, and the capacitor 52 described in relation to FIG. 5. The capacitor is brought into inverting connection with the negative reference (−) of respective amplifiers 14 and 16. The black level offset is generated for each signal path (A and B) generally as described in relation to FIG. 5. The offset voltages are used to bias the respective amplifiers 14 and 16 so that a digital black code value output is obtained for a black pixel interval.

Figure 1:
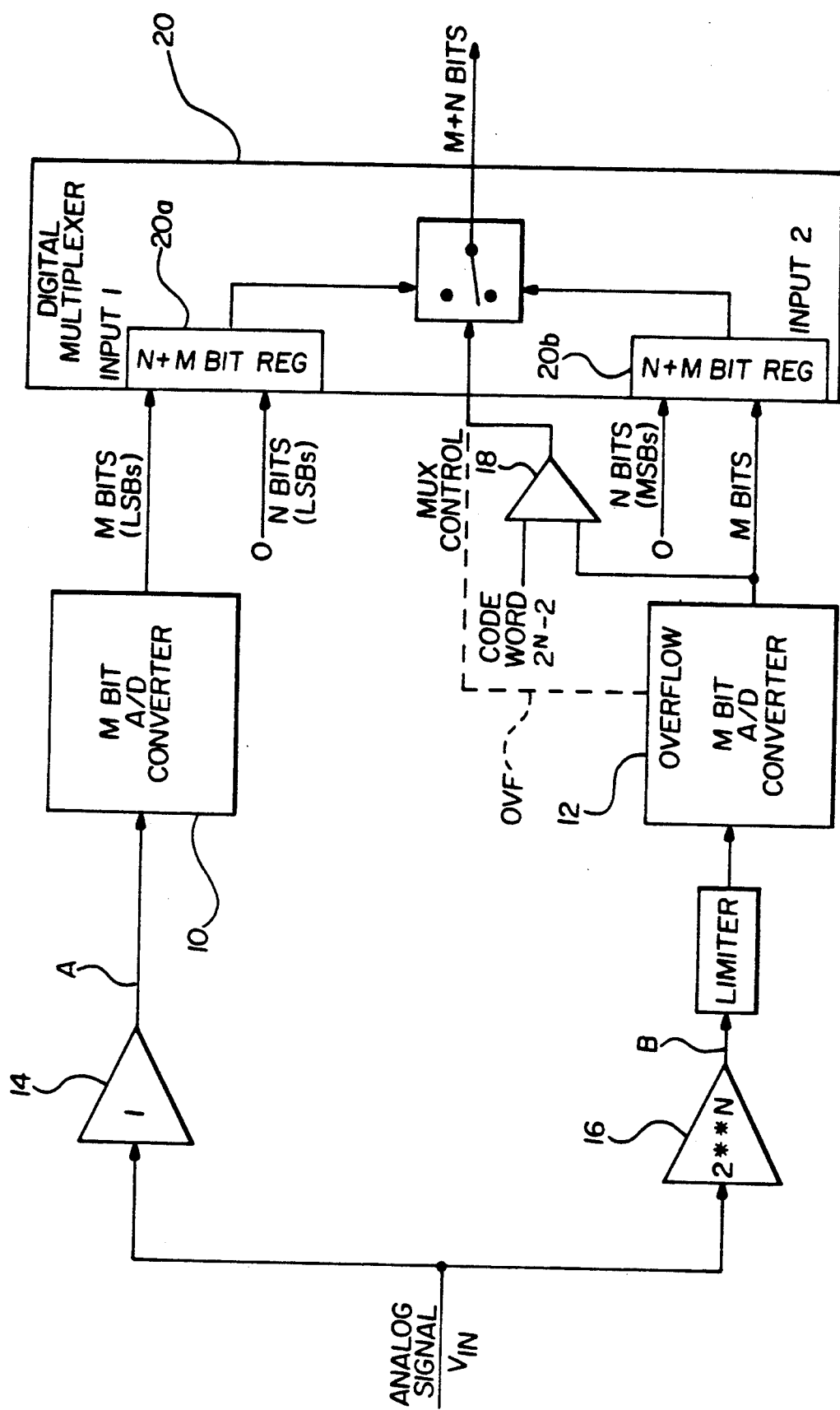
FIG. 1 is a block diagram of a known dual range A/D converter utilizing two A/D converters.
Figure 2:
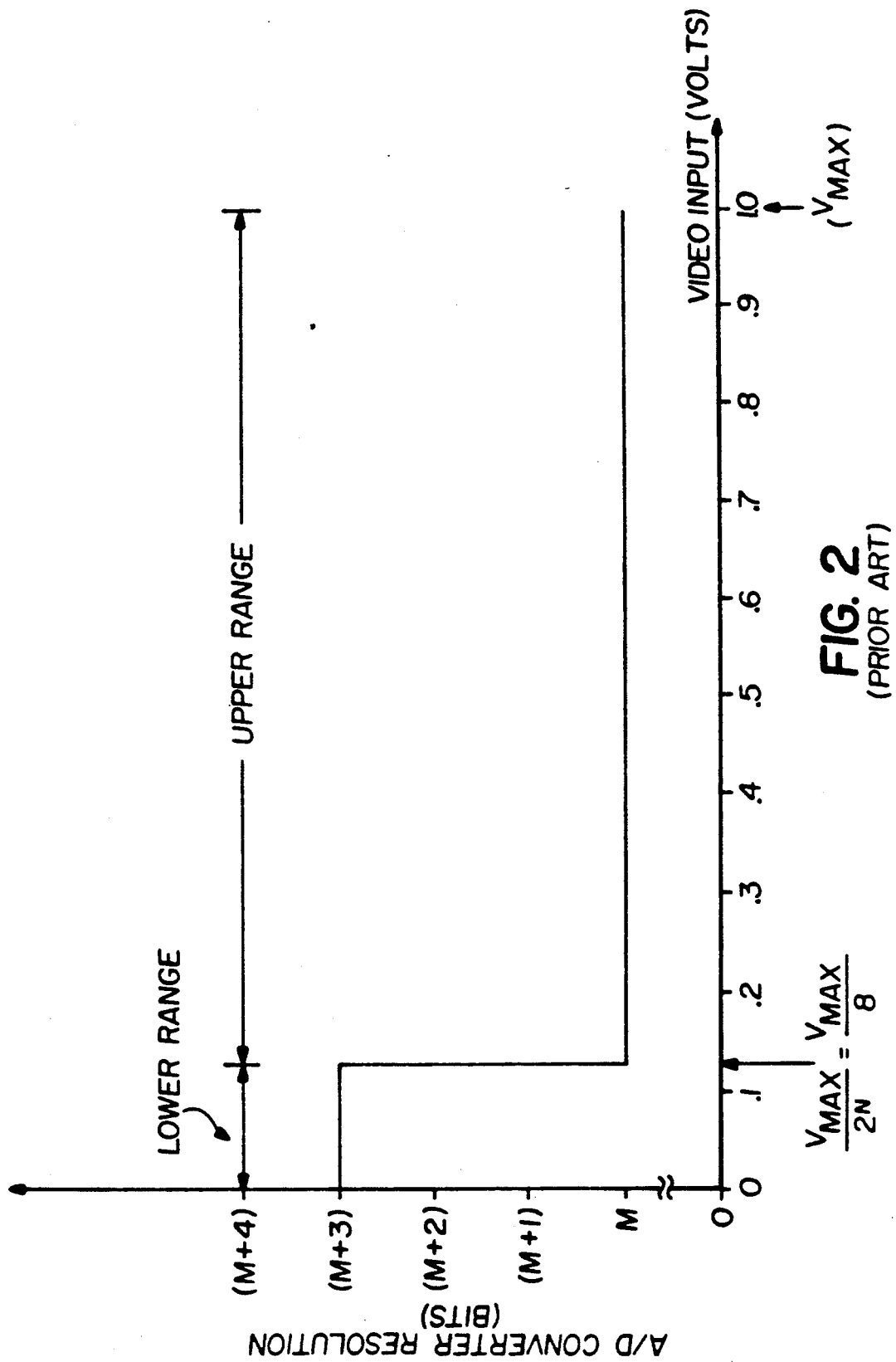
FIG. 2 is a graph showing the bit resolution for each range of the dual range A/D converter shown in FIG. 1.

As generally described in connection with FIG. 1, and as further shown in FIG. 7, the output word from the digital multiplexer 20 comprises (M+N) bits, or, in the case of the preferred embodiment, a 13 bit output word (M=10, N=3). In the low gain path A, the M bits, which are obtained from the A/D converter 10 become the MSBs (D3–D12 in the output word of FIG. 7) and the lower N bits are set to zeros. In the high gain path B, the N output MSBs are set to zeros and the M output LSBs are obtained from the A/D converter 12 (D0–D9 in the output word of FIG. 7). It is worthwhile to reiterate that the N (three) zero bits in the output word derived from the high gain path B are meaningful bits, and that the dual-range A/D converter therefore has 13 bit (M+N) resolution.

Thus, by utilizing black level correction circuitry in each A/D converter path to control the bottom point of each transfer curve and the digital gain matching circuit shown in FIG. 6 to control the upper point, and therefore the slope, of the low gain A/D converter transfer curve, automatic matching of the A/D converter paths is obtained. More specifically, with reference to the slope of the converter transfer curves, the slope of the curve for the high gain path B is set by (+) and (−) references 12a and 12b. The slopes are automatically matched by controlling the upper end point of the curve for the low gain path A. (Alternatively, although not shown, the gain of the low gain path A can be set and the upper end point of the curve for the high gain path B can be controlled.) Since both transfer curves are fully specified, the dual range A/D converter of FIG. 6 is fully self-calibrating. More particularly, the dual range A/D converter of FIG. 6 requires no adjustments, and compensates for the temperature drift of many its analog components including the A/D converters. Being essentially self compensating, it results in a high quality dual range A/D converter system that is both robust and inexpensive.

The invention has been described in detail with particular reference to a presently preferred embodiment, but it will be understood that variations and modifications can be effected within the spirit and scope of the invention. For instance, the invention can be extended to a multi-range A/D converter, which has more than two level-dependent signal paths. Each A/D converter component would have its own transfer curve; a lower end point would be matched for a black level input by a black level correction circuit as described heretofore. The upper end points would be matched by comparing the digital values during a common "overlap" interval that includes each curve. Using multiple paths has several benefits despite the added complexity. For example, the ratio of quantization step size to input signal can more nearly approach a constant value, which allows an even better approximation to the characteristics of the human visual system.

It is also worthy of note that, as higher resolution parallel A/D converters become available, the dual-range converter described herein continues to have merit both as an inexpensive alternative to expensive high resolution converters and as a preferred architecture for yet greater resolutions and higher data rates.

What is claimed is:

1. A dual range analog-to-digital converter for converting analog input signals into digital output signals, the digital signals having code values corresponding to the analog levels of the input signals, said converter comprising:

a first signal path including a first analog-to-digital converter for converting the analog input signals into first digital signals;

a second signal path including a second analog-to-digital converter for converting the analog input signals into second digital signals;

means for providing signal gain in the respective signal paths, the gain applied to the second path being a nominal multiple of the gain applied to the first path;

means for evaluating signal level in the respective signal paths, the signals in one of the paths being scaled with respect to the signals in the other path to account for the nominal gain difference, said evaluating means generating a control signal indicative of the difference in signal level between the signals as scaled;

means responsive to the control signal for adjusting the signals in at least one of the signal paths until the gain provided in the second path is substantially an exact multiple of the gain applied in the first path; and means responsive to the magnitude of the signals in the respective signal paths for generating the digital output signals from either the first signal path or the second signal path.

2. A dual range analog-to-digital converter as claimed in claim 1 wherein said first and second analog-to-digital converters are A/D converters having respective upper reference voltages.

3. A dual range analog-to-digital converter as claimed in claim 2 wherein the signals adjusted by said adjusting means responsive to the control signal are the digital signals provided by said analog-to-digital converter in said at least one of the signal paths.

4. A dual range analog-to-digital converter as claimed in claim 3 wherein said adjusting means adjusts the upper reference voltage of the converter in said at least one of the signal paths.

5. A dual range analog-to-digital converter as claimed in claim 1 wherein the signals evaluated by said evaluating means are the code values of the digital signals output by the respective analog-to-digital converters, the code values in one of the signal paths being scaled with respect to the code values in the other of the signal paths to account for the nominal gain difference.

6. A dual range analog-to-digital converter as claimed in claim 5 wherein said evaluating means is a digital comparator comparing the code values of the digital signals from the respective analog-to-digital converters, the control signal being indicative of the difference between the two digital code values.

7. A dual range analog-to-digital converter as claimed in claim 6 wherein the code value from one of the signal paths is scaled by bit shifting the code value a number of bits corresponding to the nominal gain difference.

8. A dual range analog-to-digital converter as claimed in claim 1 wherein said means providing signal gain is an amplifier arranged in said second signal path to amplify the analog input signals.

9. A dual range analog-to-digital converter as claimed in claim 1 wherein said digital output signal generating means adds a predetermined number of least significant bits to the digital signal in said first path and a predetermined number of most significant bits to the digital signal in said second path, thereby providing a total output bit resolution including the bits in the respective digital signals and said predetermined number of additional bits.

10. A dual range analog-to-digital converter as claimed in claim 9 wherein the number of said predetermined additional bits corresponds to the gain applied to said second path.

11. A dual range analog-to-digital converter as claimed in claim 1 wherein the analog input signals correspond to image pixels, including one or more pixels shaded from light, said converter further comprising:

means for generating a black correction signal responsive to the difference between the signals derived from the light-shaded pixels and a black reference value; and means for adjusting said gain providing means so as to modify the gain applied to at least one of the signal paths until the difference between the signals is eliminated, thereby providing a analog-to-digital converter that self-calibrates for black level and gain.

12. A dual range analog-to-digital converter for converting analog image signals having a detectable black level into digital image signals, said converter comprising:

first analog-to-digital conversion means having a first transfer curve relating a digital output value to an input signal level of the analog image signals;

second analog-to-digital conversion means having a second transfer curve relating a digital output value to an input signal level of the analog image signals, said first and second transfer curves further defining different transfer characteristics;

means for amplifying the analog image signals provided to at least one of said first and second analog-to-digital conversion means, whereby the gain applied to the analog image signals provided to said second analog-to-digital conversion means is a nominal multiple of the gain applied to the signals provided to said first analog-to-digital conversion means;

means responsive to signal magnitude for selecting a digital output from either said first or said second analog-to-digital conversion means;

black level correction means for matching a lower end of the first and second transfer curves to the black level of the video signal; and gain matching means, responsive to the difference in gain applied to the respective conversion means, for adjusting an upper end of at least one of the transfer curves so as to equalize the gain applied to the digital output of the respective first and second analog-to-digital conversion means, whereby the gain applied in the second analog-to-digital conversion means is substantially an exact multiple of the gain applied in the first analog-to-digital conversion means.

13. A dual range analog-to-digital converter as claimed in claim 12 wherein said gain matching means comprises:

means for comparing the digital image signals output by respective analog-to-digital conversion means, the digital image signals input to said comparing means being relatively scaled to eliminate the gain applied to the signals provided to said second conversion means;

means responsive to an output of said comparing means for modifying the amount of gain applied to signals processed by at least one of said conversion means.

14. A dual range analog-to-digital converter as claimed in claim 13 wherein further means provide a gain matching signal active during a gain matching interval, and said gain matching means responds to said gain matching signal and is operative during the gain matching interval.

* * * * *